United States Patent [19]

McKee et al.

[11] Patent Number: 5,279,028
[45] Date of Patent: Jan. 18, 1994

[54] METHOD OF MAKING A PIN GRID ARRAY AND TERMINAL FOR USE THEREIN

[75] Inventors: Michael J. McKee, New Cumberland; Joseph M. Pawlikowski, Lancaster, both of Pa.

[73] Assignee: The Whitaker Corporation, Wilmington, Del.

[21] Appl. No.: 55,657

[22] Filed: Apr. 30, 1993

[51] Int. Cl.⁵ ............................................... H01R 4/02
[52] U.S. Cl. ...................................... 29/843; 439/876; 439/83; 219/85.18; 219/549; 219/10.77
[58] Field of Search .................. 439/874–876, 83; 219/10.77, 85.18, 549; 29/827, 876, 882, 843

[56] References Cited

U.S. PATENT DOCUMENTS

| | | | |
|---|---|---|---|
| 4,256,945 | 3/1981 | Carter et al. | 219/10.75 |
| 4,623,401 | 11/1986 | Derbyshire et al. | 148/13 |
| 4,626,767 | 12/1986 | Clappier et al. | 323/280 |
| 4,659,912 | 4/1987 | Derbyshire | 219/535 |
| 4,695,713 | 9/1987 | Krumme | 219/553 |
| 4,701,587 | 10/1987 | Carter et al. | 219/10.75 |
| 4,717,814 | 1/1988 | Krumme | 219/553 |
| 4,745,264 | 5/1988 | Carter | 219/553 |
| 4,789,767 | 12/1988 | Doljack | 219/9.5 |
| 4,795,870 | 1/1989 | Krumme | 219/9.5 |
| 4,852,252 | 8/1989 | Ayer | 29/860 |
| 4,995,838 | 2/1991 | Ayer et al. | 439/874 |
| 5,032,702 | 7/1991 | Scholz | 219/85.18 |
| 5,032,703 | 7/1991 | Henschen et al. | 219/85.18 |
| 5,059,756 | 10/1991 | Heuschenp et al. | 219/85.18 |
| 5,090,116 | 2/1992 | Henschen et al. | 439/876 |
| 5,103,071 | 4/1992 | Henschen et al. | 219/85.18 |
| 5,227,596 | 7/1993 | McGaffigan et al. | 219/10.77 |

FOREIGN PATENT DOCUMENTS 0241597 10/1987 European Pat. Off. .

Primary Examiner—Gary F. Paumen
Attorney, Agent, or Firm—Katherine A. Nelson

[57] ABSTRACT

A grid array 10 of terminals 20 secured with a fusible electrically conductive material 34 usable in conjunction with a source of constant amplitude high frequency alternating current of known frequency is formed by the steps of: selecting a plurality of terminals 20 having a thin magnetic layer 30 defined thereon, transforming the terminal into a Curie point heater, each terminal 20 including a first connecting section 24 having a fusible electrically conductive material 34 disposed thereon; releasably holding each of the terminals 20 precisely positioned within an array 22 corresponding to an array 14 of circuit termini 16 of a circuit bearing article 12 such that each of the first connecting sections 24 of the terminals 20 is substantially in physical engagement with a corresponding circuit terminus 16; interposing an electrical conductor 60 connected to the source of alternating current among and adjacent each terminal 20 positioned within the array 22; subjecting each heater body to said constant current of known frequency, the heater body resultingly generating and transferring sufficient thermal energy to melt the fusible material 34 thereby electrically and mechanically interconnecting the terminals 20 to the respective circuit termini 16; and releasing the terminals 20.

2 Claims, 4 Drawing Sheets

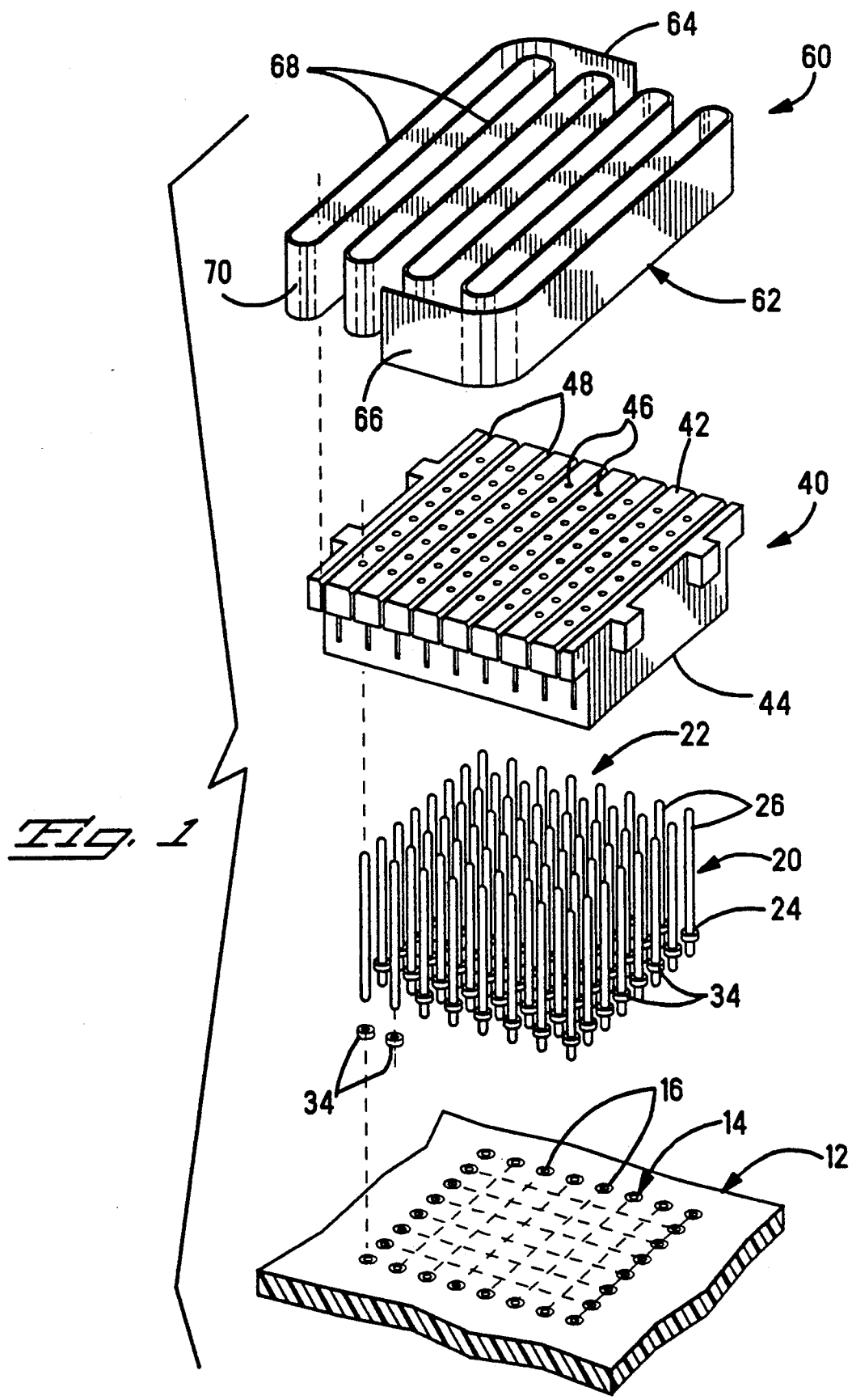

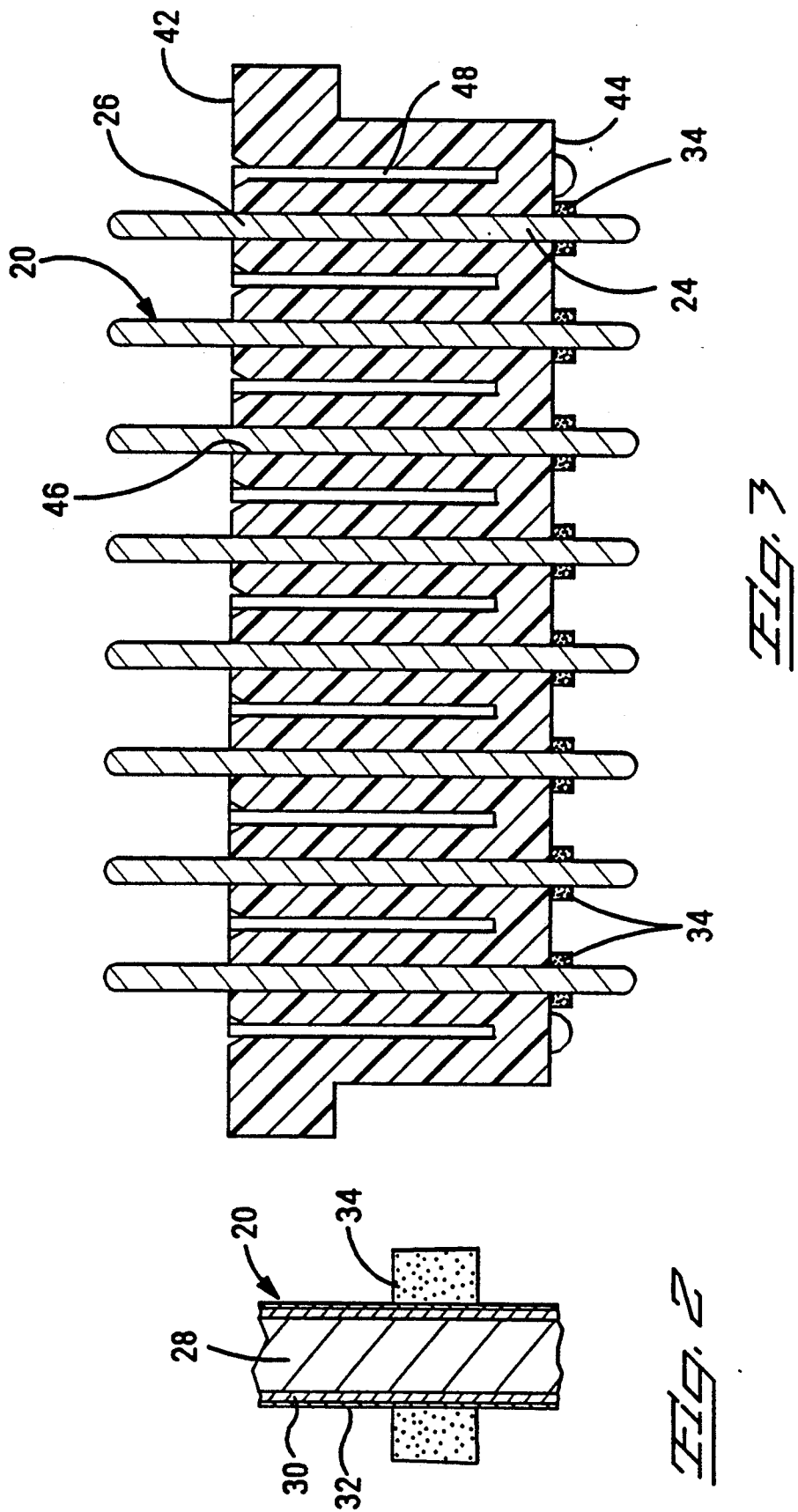

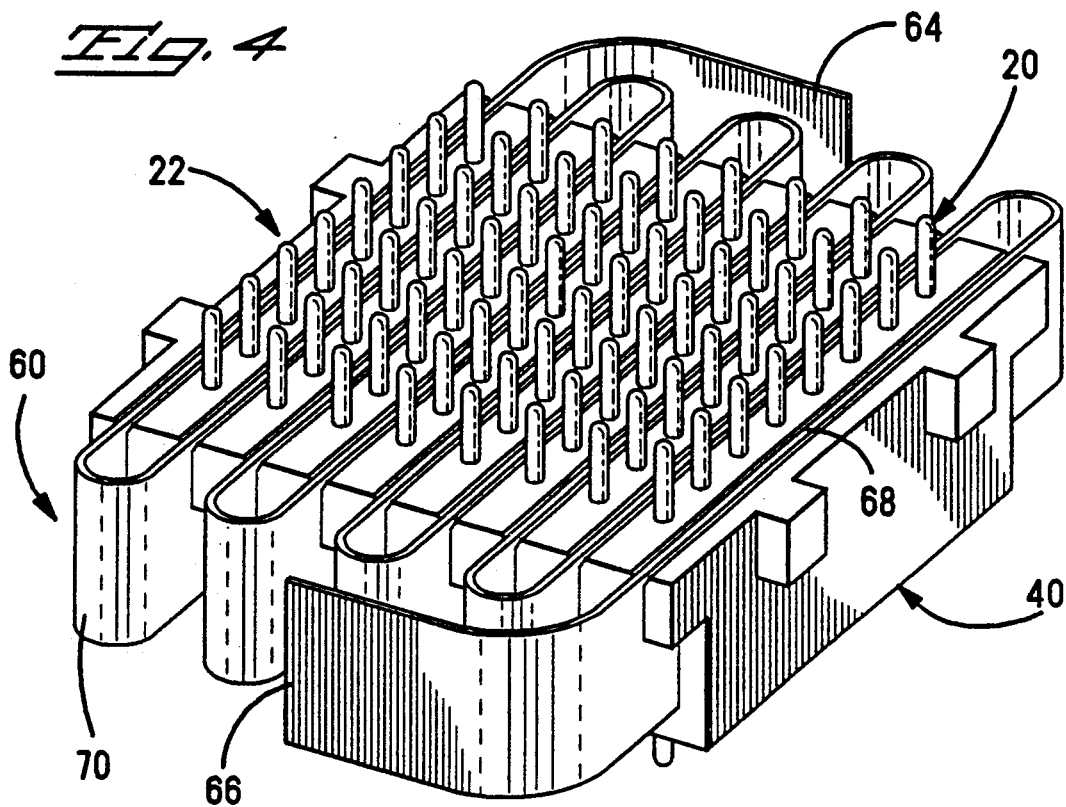
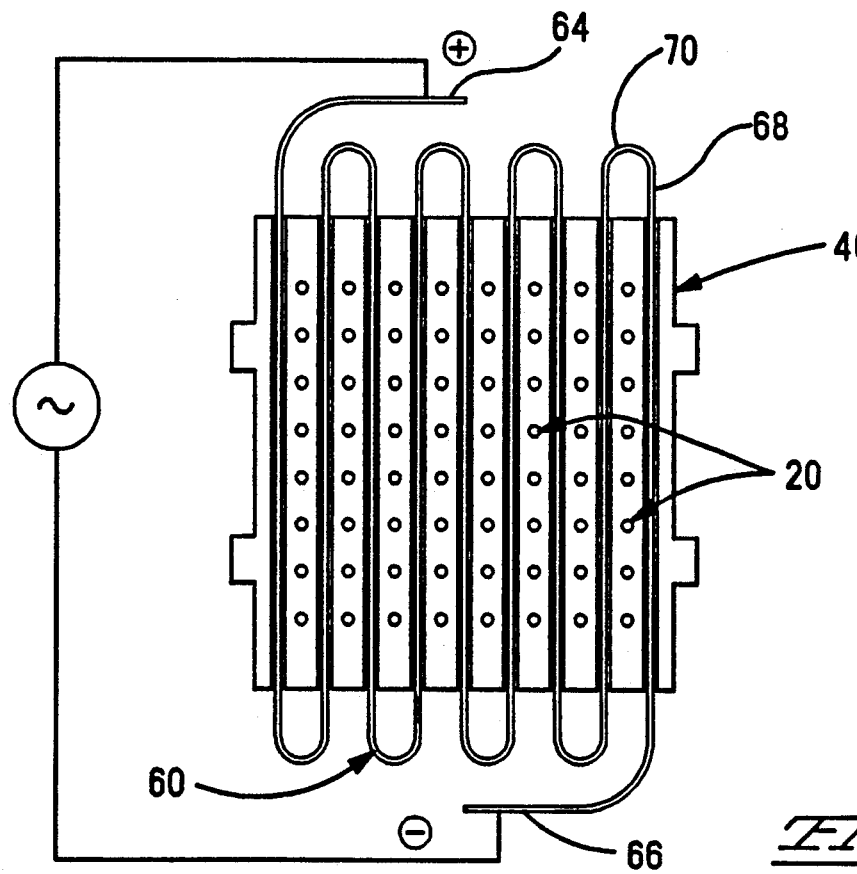

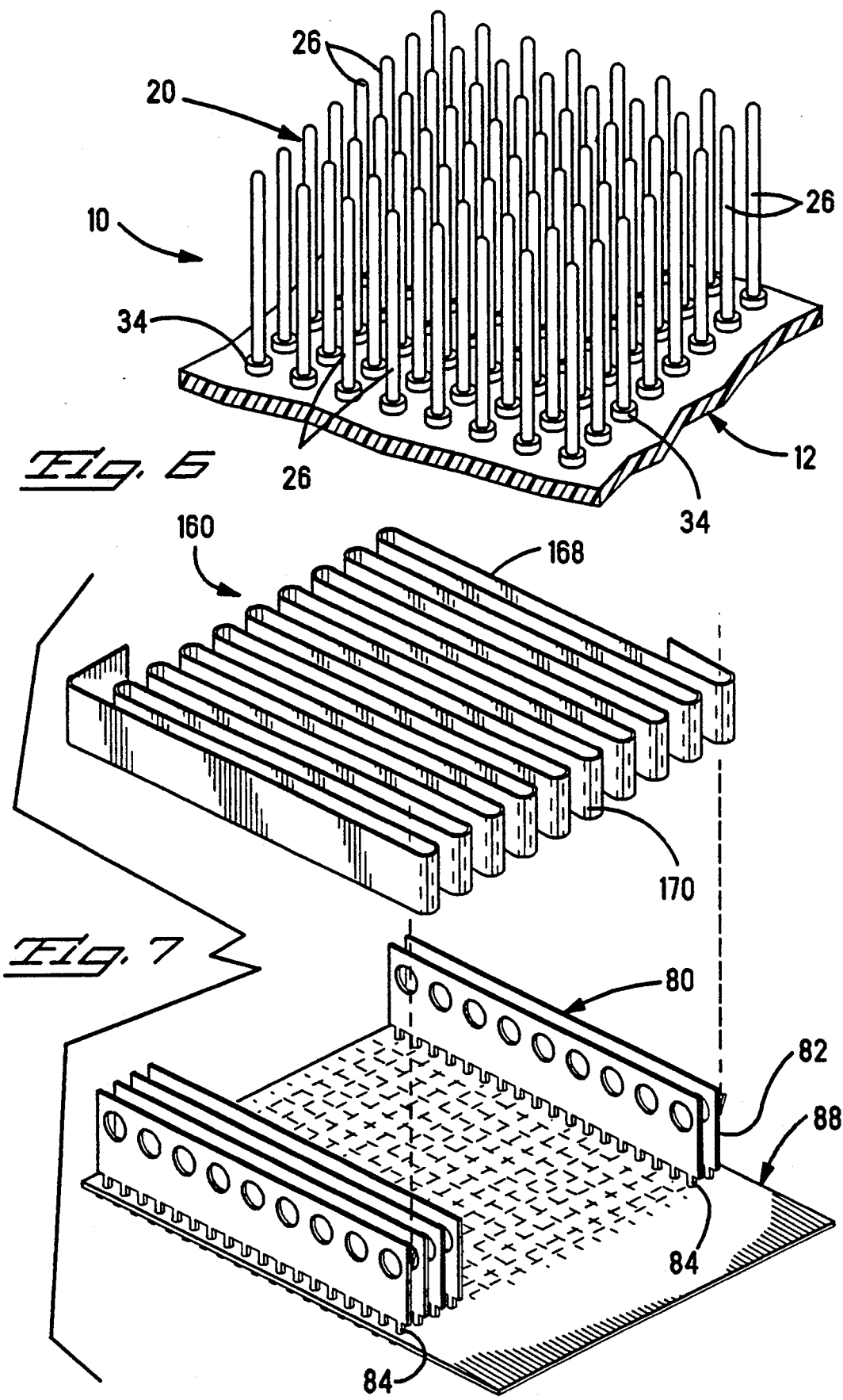

METHOD OF MAKING A PIN GRID ARRAY AND TERMINAL FOR USE THEREIN

FIELD OF THE INVENTION

The present invention relates to the field of electrical connectors and more particularly to connectors having a grid array of terminals.

BACKGROUND OF THE INVENTION

Electrical connectors are known that include housings and a plurality of terminals arranged in a grid array of terminals typically arranged in multiple rows and columns. Often the connector is then mounted to a circuit board or back plane and the terminals are conventionally connected to conductive traces thereof by their contact sections being soldered thereto. Generally the circuit board or back plane must also accommodate means for securing the housing to the board, which requires some space around the grid array. With the increasing need miniaturization as well as the need to increase the capabilities of electronic devices, space on circuit board and back planes is at a premium.

It is therefore desirable to minimize the amount of space required for grid array of terminals.

It is further desirable to provide a method for securing the terminals in grid arrays to a circuit board without the need to expose all of the components thereon to the high temperature required by wave soldering and the like.

U.S Pat. No. 4,852,252 discloses providing each of the terminals of a connector with a thin layer of magnetic material along the surface of the nonmagnetic low resistance solder tail of the terminal facing away from the surface to which a wire end will be soldered; in U.S. Pat. No. 4,995,838 a preform of foil having a magnetic layer is disclosed to be soldered to the terminal solder tail's wire-remote surface. The bimetallic structure uses the Curie temperature of the magnetic material to define an article which will generate thermal energy when subjected to radio frequency current of certain frequency for sufficient short length of time until a certain known temperature is achieved, above which the structure is inherently incapable of rising; by selecting the magnetic material and sufficient thickness thereof and selecting an appropriate solder, the temperature achieved can be selected to be higher than the reflow temperature of the solder preform; when the terminal is subjected through induction to RF current of the appropriate frequency, the solder tail will generate heat which will radiate to the solder preform, reflow the solder, and be conducted along the wire and the terminal and radiate further to shrink the tubing and melt the sealant material. The terminal thus includes an integral mechanism for enabling simultaneous soldering and sealing without other application of heat; excess heat is avoided as is the potential of heat damage to remaining portions of the connector or tubing.

Another U.S. Pat. No. 4,789,767 discloses a multipin connector whose contacts have magnetic material layers on portions thereof spaced from the contact sections to be surface mounted to respective traces on the surface of a printed circuit board. An apparatus is disclosed having a coil wound magnetic core having multiple shaped pole pieces in spaced pairs with an air gap therebetween within which the connector is placed during soldering. The pole pieces concentrate flux in the magnetic contact coating upon being placed beside the contact sections to be soldered, to transmit RF current to each of the contacts, generating thermal energy to a known maximum temperature to reflow the solder and join the contact sections to the conductive traces of the printed circuit element.

Such Curie point heating is disclosed in U.S. Pat. Nos. 4,256,945; 4,623,401; 4,659,912; 4,695,713; 4,701,587; 4,717,814; 4,745,264 and European Patent Publication No. 0241,597. When a radio frequency current for example is passed through such a bipartite structure, the current initially is concentrated in the thin high resistance magnetic material layer which causes heating; when the temperature in the magnetic material layer reaches its Curie temperature, it is known that the magnetic permeability of the layer decreases dramatically; the current density profile then expands into the non-magnetic substrate of low resistivity. The thermal energy is then transmitted by conduction to adjacent structure such as wires and solder which act as thermal sinks; since the temperature at thermal sink locations does not rise to the magnetic material's Curie temperature as quickly as at non-sink locations, the current remains concentrated in those portions of the magnetic material layer adjacent the thermal sink locations and is distributed in the low resistance substrate at non-sink locations. It is known that for a given frequency the self-regulating temperature source thus defined achieves and maintains a certain maximum temperature dependent on the particular magnetic material. One source for regenerating radio frequency current such as of 13.56 mHz is disclosed in U.S. Pat. No. 4,626,767.

The conductive substrate can be copper having a magnetic permeability of about one and a resistivity of about 1.72 micro-ohm-centimeters. The magnetic material may be for example a clad coating of nickel-iron alloy such as Alloy No. 42 (42% nickel, 58% iron) or Alloy No. 42-6 (42% nickel, 52% iron and 6% chromium). Typical magnetic permeabilities for the magnetic layer range from fifty to about one thousand, and electrical resistivities normally range from twenty to ninety micro-ohm-centimeters as compared to 1.72 for copper; the magnetic material layer can have a Curie temperature selected to be from the range of between about 200° C. to about 500° C., for example. The thickness of the magnetic material layer is typically one to two skin depths; the skin depth is inversely proportional to the square root of the product of the magnetic permeability of the magnetic material and the frequency of the alternating current passing through the two-layer structure. Solders can be tin-lead such as for example Sn 63 reflowable at a temperature of about 183° C. or Sb-5 reflowable at a temperature of about 240° C. Generally it would be desirable to select a Curie temperature of about 15° C. to 75° C. above the solder reflow temperature.

SUMMARY OF THE INVENTION

The present invention is a method for assembling a plurality of terminals into a grid array thereof secured with a fusible electrically conductive material that is usable in conjunction with a source of constant amplitude high frequency alternating current of a known frequency. The terminal grid array is formed on a circuit bearing electrical article such as a circuit board or back plane, which includes an array of circuit termini for electrical connection for each thereof to a respective terminal of the terminal array.

Each terminal to be used in the array includes a first connecting section adapted to be secured with fusible electrically conductive material to a selected circuit terminus. At least a selected portion of each of the first connecting sections is formed of a first metal having a low electrical resistance and minimal magnetic permeability, the first metal defining a first layer. The selected portion further has a second layer of metal integrally joined to the first layer, the second metal having a high electrical resistance and high magnetic permeability and being at least equal to one skin depth of the second metal at the known frequency. The terminal portion thereby defines a heater body. Each of the first connecting sections further has a fusibly electric conductive material disposed on selected locations thereof.

Each of the terminals are then precisely positioned within an array corresponding to the array of circuit termini on the circuit board or other electrical article in a manner to expose the first connecting section of the terminals adjacent and substantially in physical engagement with the respective circuit terminus. In one embodiment of the invention, the terminals are releaseably held in a dielectric fixture during the soldering process. An electrical conductor connectable to a source of alternating current is then interposed among and adjacent each of the terminals in the array. The conductor is connected to the source of alternating current. Upon activation of the source the primary current through the conductor induces eddy currents in the heater body such that the heater body resultingly generates and transfers sufficient thermal energy to melt the fusible material of the connecting section. The first terminal connecting portions are thereby electrically and mechanically interconnected to the corresponding circuit termini of the electrical article, thus defining a grid array. The terminals are then released from the fixture or holding device. The resulting grid array of terminal is thereby directly secured to the circuit board without the need of permanent housing thereby conserving space on the board or back plane.

With the present invention, no manual soldering of individual terminals is necessary nor are other conventional soldering processes necessary, such as a vapor phase reflow process wherein the entire circuit board element would have to be subjected to high temperatures of the levels necessary to reflow solder in order to mount the connector contacts to the traces. With the heat generated very quickly at only the solder sites for a very brief period of time, little heat remains to have deleterious effects.

It is an object of the present invention to fabricate a grid array connector that minimizes the space required on the board.

It is another object to provide for a simplified process of soldering the terminals of the grid array.

It is a further object to provide an electrical conductor that allows for simultaneous soldering of a plurality of terminals in conjunction with a source of constant amplitude high frequency alternating current.

Embodiments of the present invention will now be described in detail, with reference to the accompanying drawings.

BRIEF DESCRIPTION OF THE DRAWINGS

FIG. 1 is an exploded view of the various elements used in making the grid array of terminals in accordance with the present invention.

FIG. 2 is an enlarged cross-sectional view of the terminals used in FIG. 1.

FIG. 3 is an cross-sectional view of the terminals mounted in the fixture of FIG. 1.

FIG. 4 is a perspective view of the terminals and conductors held in the fixture with the conductor being interposed between rows of the terminal array in accordance with the method of the present invention.

FIG. 5 is a top plan view of FIG. 4 and further illustrates the connection of the conductor to a source of alternating current.

FIG. 6 is a fragmentary portion of a pin grid array formed by the method of the present invention.

FIG. 7 is a perspective and exploded view of an alternative array of electrical connecting devices connected in accordance with the method of the present invention.

DETAILED DESCRIPTION OF THE DRAWINGS

Referring now to FIGS. 1 and 6, FIG. 6 illustrates the grid array 10 of terminals 20 formed on the circuit board 12 and made in accordance with the present invention. FIG. 1 illustrates the elements used in forming the grid array 10 of FIG. 6. The method uses a circuit bearing electrical article 12 such as a circuit board having an array 14 of circuit termini 16 for electrical connection thereof to respective terminals 20 of a corresponding terminal array 22. The terminals 20 are arranged in a plurality of rows. Each terminal 20 includes a body having a first connecting section 24 adapted for electrical connection to the corresponding circuit termini 16 and a second connecting section 26 adapted for electrical connection to a mating connector (not shown). At least a portion of the terminal body defines a heater body portion, which is in communication with said first connecting portion 24. For purposes of illustrating the invention, terminal 20 is shown as a pin terminal. It is to be understood that the invention is not to be limited to pin terminals.

The details of the structure of the terminal 20 are shown in FIG. 2. In a preferred embodiment, the terminal body is formed of a first metal 28 having a low electrical resistance and minimal magnetic permeability and defining a first layer. A second layer 30 of metal is integrally joined to the first layer 28, the second metal having a high electrical resistance and high magnetic permeability. The second layer 30 has a thickness at least equal to one skin depth of the second metal given the known frequency. These two layers of materials define a heater body. In the preferred embodiment the heater body is a self-regulating heater. In the preferred embodiment of the terminals, the terminals are made from continuously extruded wire of the first material and have a cladding of the second material extending therealong. The wire is then cut into the desired length to form individual terminals. Each terminal is in effect a self-regulating heater. It is to be understood, however, that other methods may be used for making the terminals and that the heater body need be provided at least in the area of the first connecting section of the terminal. To enhance the solderability of the terminals 20, a thin layer of solder compatible material 32 is also disposed on the first connecting section 24. In a preferred embodiment the solder compatible material may be 15 microinches of gold, or other suitable materials, as known in the art. It is important, however, that the thickness of the solder compatible material not interfere with the self-regulating feature of the heater. In one embodiment of the invention, the wire used for making a typical pin terminal is about 0.025 inches in diameter, the second layer is about 0.0005 inches thick and the layer of gold is about 0.000015 inches thick. A solder preform 34 is then disposed on the terminal member 20.

Referring now to FIGS. 1 and 3, a fixture 40 is used to releaseably hold each of the terminals 20 precisely positioned within the array 22 which corresponds to the array 14 of the circuit termini on board 12. Fixture 40 is preferably formed of a high temperature solder resistant electrically and thermally nonconductive plastic material such as for example a suitable liquid crystal polymers or other materials as known in the art. Fixture 40 includes an upper surface 42, a lower surface 44, a plurality of terminal receiving apertures 46 extending therebetween and a plurality of conductor receiving grooves 48 extending alongside and in between each of the rows of terminal receiving apertures 46 and extending through opposed sides 41 of fixture 40. The rows of apertures 46 correspond to the rows of the circuit termini 16 on board 12. The apertures 46 are dimensioned to slidingly receive and hold the terminals 20 in position during the assembly process while allowing the fixture 40 to be removed from the soldered terminals without straining the soldered connections. The terminals 20 each with a solder fillet or preform 34 disposed on the first connecting section 24 thereof are releaseably held in a precise position within the desired array of the fixture 40. The solder preforms 34 are dimensioned to be snugly received on the individual terminal 20. In practice, it is preferable to insert the terminals 20 into the terminal receiving apertures 46 from surface 41 with the second surface 44 uppermost so that the solder fillets 34 are retained in the desired position against surface 44 and aligned for interconnection with the board 12. The electrical article 12 is then superimposed on the fixture 40 such that the second terminal connecting portions 24 are inserted into the respective circuit termini 16 of the board 12. The fixture and board are then turned over to expose the conductor receiving slots 48.

In accordance with the method of the invention, a continuous conductor 60 is used to provide eddy currents in the respective heater bodies of the terminals 20. Conductor 60 includes a conductor body 62 having electrodes 64,66 at opposed ends thereof. The conductor is formed into a serpentine shape having a continuous array of sections 68 joined by bight portions 70. Each section 68 is joined to succeeding ones by a bight portion. The conductor body 62 is shaped so that the section 68 are configured to be disposed parallel to each other with each section having a length at least as great as the know length of the rows of the array 22 of terminals. The sections 68 are further spaced to correspond to the known spacing between the rows of the array 22. As shown in FIG. 4, the conductor is adapted to be interposed among and between the rows of the array 22 and in the grooves 48 of the fixture 40 such that the bight portions 70 extend beyond the sides 41 of fixture 40 and at least one section 68. A conductor is proximate each of the terminal members 20 in the array 22. The conductor 60 is preferably a strip of copper about 0.010 inches thick and 0.125 inches wide.

FIG. 5 shows a top plan view of FIG. 4 with the conductor 60 being connected to the source of constant amplitude alternating current and the resulting primary current through the conductor induces eddy currents in the heater body portions of the terminals. The terminal heater body resultingly generates and transfers sufficient thermal energy to melt the fusible material disposed along the first connecting section thereby electrically and mechanically interconnecting the first connecting sections to the corresponding and respective circuit termini of the electrical article thereby defining the grid array. The fusing process takes about 10–15 seconds with a maximum temperature being that of the Curie temperature of the selected alloy. Upon removing the conductor and releasing the terminals from the fixture, the grid array 10 remains on the circuit bearing article 12 as shown in FIG. 6.

FIG. 7 illustrates another use of serpentine conductor 160 having a plurality of straight sections 168 and bight sections 170 used in terminating a grid array of longitudinal conductor strips having heater body portion 82 and connecting portion 84 mounted onto the circuit board 88 with the connecting portions 84 extending through holes in the circuit board to the undersurface thereof. Details of the alternative grid array are found in co-pending U.S. patent application Ser. No. 08/055,603 filed concomitantly herewith.

The present invention provides a method whereby a grid array of terminals can be terminated directly to a circuit carrying electrical article without the need for a permanent housing. The invention further provides the advantage of forming a grid array without the need to subject the device to temperatures required for solder reflow operations or the like. An additional advantage of the present invention is the provision of an electrical conductor suitable for use in conjunction with a source of constant amplitude high frequency alternating current to provide sufficient thermal energy to melt a fusibly electrically conductive material to form interconnections of contact arrays.

It is thought that the method of the present invention and the terminal for use therein and many of the attendant advantages will be understood from the foregoing description. It is apparent that various changes may be made in the form, construction, and arrangement of the parts used method without departing from the spirit or scope of the invention or sacrificing all of its material advantages.

We claim:

1. A method for assembling a plurality of terminals into a grid array thereof secured with a fusible electrically conductive material usable in conjunction with a source of constant amplitude high frequency alternating current of known frequency, said method comprising the steps of:

selecting a circuit-bearing electrical article having an array of circuit termini for electrical connection of each thereof to a respective terminal of a corresponding terminal array;

selecting a plurality of terminals, each terminal including a first connecting section adapted for being secured with a fusible electrically conductive material to a selected circuit terminus, said terminals being formed of a first metal having low electrical resistance and minimal magnetic permeability, said first metal defining a first layer, said terminals further having defined on at least said first connecting section and integrally joined to said first layer thereof a second layer of a second metal having high electrical resistance and high magnetic permeability, said second layer having a thickness at least equal to one skin depth of said second metal, given said known frequency, said first connecting section thereby defining a heater body, each of said first connecting portions being adapted to be disposed adjacent and in physical engagement with a corresponding circuit terminus of said electrical article, each said first connecting portion having fusible electrically conductive material disposed on selected locations thereof;

releasably holding each of said terminals precisely positioned within an array corresponding to the array of circuit termini of said electrical article in a manner exposing said first connecting sections of said terminals adjacent and substantially in physical engagement with a corresponding circuit terminus of said electrical article;

providing an electrical conductor connected to the source of alternating current and adapted to be interposed among and adjacent each said terminal held precisely positioned within said array;

placing said electrical conductor to be interposed in said array;

activating said source of alternating current and subjecting each said heater body to said constant current of known frequency, said heater body resultingly generating and transferring said sufficient thermal energy from said heater body to melt said fusible material disposed therealong thereby electrically and mechanically interconnecting said first connecting portions to said corresponding and respective circuit termini of said electrical article and defining a grid array; and releasing said terminals.

2. The method according to claim 1 wherein said fusible material is solder and said method further includes the step of disposing a thin layer of solder compatable material on said at least first connecting portions of said terminals to enhance the solderability of said terminals.

* * * * *